(12) United States Patent
Kountz et al.

(10) Patent No.: US 7,314,832 B2
(45) Date of Patent: Jan. 1, 2008

(54) LOW TEMPERATURE TEXTURING LAYER TO ENHANCE ADHESION OF SUBSEQUENT LAYERS

(75) Inventors: Michael Kountz, Gilbert, AZ (US); Randy Olsen, Chandler, AZ (US); Michael Adamson, Gilbert, AZ (US)

(73) Assignee: Pan Jit Americas, Inc., Tempe, AZ (US)

( * ) Notice: Subject to any disclaimer, the term of this patent is extended or adjusted under 35 U.S.C. 154(b) by 0 days.

(21) Appl. No.: 11/097,443

(22) Filed: Apr. 4, 2005

(65) Prior Publication Data

US 2005/0230776 A1    Oct. 20, 2005

Related U.S. Application Data

(63) Continuation of application No. PCT/US03/31224, filed on Oct. 3, 2003.

(60) Provisional application No. 60/415,518, filed on Oct. 3, 2002.

(51) Int. Cl.
*H01L 21/311* (2006.01)

(52) U.S. Cl. .................. 438/694; 438/118; 257/466

(58) Field of Classification Search ................ 438/118, 438/694; 257/466
See application file for complete search history.

(56) References Cited

U.S. PATENT DOCUMENTS 6,472,014 B1 * 10/2002 Matsuba .................. 427/202

* cited by examiner

*Primary Examiner*—Fernando L. Toledo
*Assistant Examiner*—Nicholas J. Tobergte
(74) *Attorney, Agent, or Firm*—Dowell & Dowell P.C.

(57) ABSTRACT

A method of forming a film on a substrate. In accordance with the invention, an adhesion layer is formed on the substrate. The adhesion layer is chemically bonded to the substrate and has a textured surface. The film is then formed on the textured surface of the adhesion layer.

16 Claims, 2 Drawing Sheets

LOW TEMPERATURE TEXTURING LAYER TO ENHANCE ADHESION OF SUBSEQUENT LAYERS

CROSS REFERENCE TO RELATED APPLICATIONS

This application is a continuation of PCT/US2003/31224 filed on Oct. 3, 2003 in the name of the same inventors which is based on U.S. Provisional Patent Application Ser. No. 60/415,518 which was filed on Oct. 3, 2002 in the name of the same inventors.

TECHNICAL FIELD

The present invention relates to device fabrication processes, and in particular to a low temperature texturing layer to enhance adhesion of subsequent layers.

BACKGROUND OF THE INVENTION

Recent advances in low temperature deposition techniques have created the possibility of fabricating new and/or dramatically improved devices. An impediment to the development of such devices, however, is the generally poor adhesion between low temperature films and the surface of an integrated circuit structure (e.g. a wafer or an individual IC chip) a which provides the film's substrate. In some case, alternative fabrication techniques may be used. For example, the film may be deposited on a separate substrate, which is selected on the basis of obtaining satisfactory adhesion with the film. The substrate is then trimmed and mounted close to the IC structure, so that electrical connections between the film and the IC can be made.

An example of this approach is in the fabrication of infra-red (IR) sensors and IR sensor arrays. In these devices, Lead Selenide (PbSe) films have traditionally been used as the sensor elements, which are then electrically connected to an IC chip, to form a discrete IR detector device. Ideally, it would be desirable to form Lead Selenide (PbSe) film(s) directly on the surface of the IC chip. However, because of the low adhesion between PbSe and silicon, this has not been possible. Accordingly, IR detector devices have been made by depositing the PbSe film(s) on a glass substrate. With this arrangement, the PbSe films can be supported proximal the IC chip, and electrical connections made as appropriate. While this technique enables the fabrication of IR sensors, the inability to form PbSe film(s) directly onto a silicon structure (such as an IC chip) reduces design flexibility and greatly increases costs.

Accordingly, techniques for forming low temperature films on a substrate with satisfactory adhesion remain highly desirable.

SUMMARY OF THE INVENTION

An object of the present invention is to provide a method for forming low temperature films on a substrate with satisfactory adhesion.

An aspect of the present invention provides a method of forming a film on a substrate. In accordance with the invention, an adhesion layer is formed on the substrate. The adhesion layer is chemically bonded to the substrate and has a textured surface. The film is then formed on the textured surface of the adhesion layer.

BRIEF DESCRIPTION OF THE DRAWINGS

Further features and advantages of the present invention will become apparent from the following detailed description, taken in combination with the appended drawings, in which:

FIGS. 2a-1e schematically illustrate successive steps in a process in accordance with an embodiment of the present invention for fabricating the device of FIG. 1.

It will be noted that throughout the appended drawings, like features are identified by like reference numerals.

DETAILED DESCRIPTION OF THE PREFERRED EMBODIMENT

The present invention provides a method of forming a low temperature film on a substrate with improved adhesion. The present invention also provides devices constructed using the method. The present Invention is particularly suited to situations in which differential rates of thermal expansion severely degrade adhesion between the film and the substrate. This situation is commonly encountered, for example, when it is desired to form a metallic film on a silicon substrate. Embodiments of the present invention is described below with reference to FIGS. 1-3.

Figure 1:
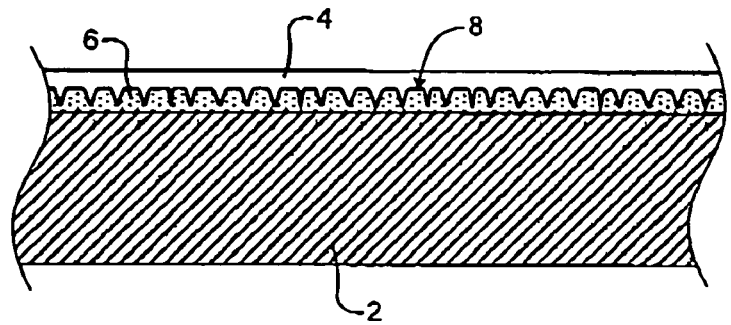
FIG. 1 is a cross-sectional view showing principal elements of a device fabricated in accordance with the present invention.

As may be seen in FIG. 1, the present invention enables improved adhesion between a substrate 2 and a film 4 by providing an intermediate adhesion layer 6 having a textured surface 8. The adhesion layer 6 is preferably formed of a material that will chemically bond to the substrate 2 using convention methods. Subsequent processing of the adhesion layer 6 creates the textured surface 8 having a desired is surface roughness- This textured surface 8 enables a mechanical bond between the film 4 and the adhesion layer 6 which substantially prevents separation of the film 4 from the adhesion layer 6 (and thus the substrate 2) during subsequent processing or use.

A typical example of the present invention is the fabrication of a thin-film Lead Selenide (PbSe) sensor on a silicon substrate which may, for example, be an integrated circuit structure. To date, no process has been available which allows the PbSe sensor to adequately adhere to the silicon substrate. The method of the present invention, which overcomes these limitations, is illustrated in FIGS. 2a-2e.

Figure 2A:
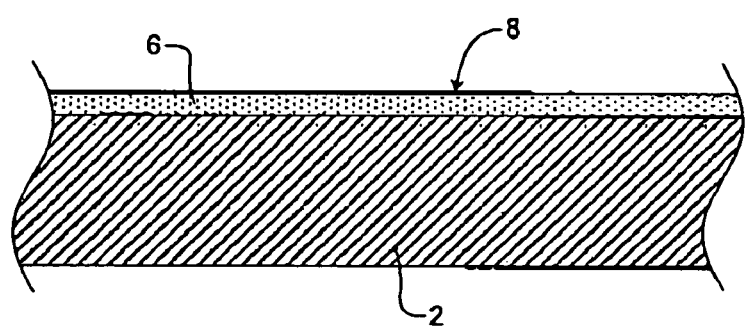

Referring to FIG. 2a, in a first step, an adhesion layer 6 is deposited on the substrate structure 2. Any suitable deposition technique may be used, consistent with the adhesion layer material and the substrate 2. For example, in cases where the substrate 2 is an integrated circuit (IC) structure, low temperature deposition techniques (such as, for example, low temperature plasma, sputtering, chemical vapour, etc.) will be appropriate, so as to prevent thermal damage to the IC.

Similarly, any suitable material may be used for the adhesion layer 6, consistent with the requirements that the adhesion layer 6 must form a reliable chemical bond with the substrate 2, while not interfering with the with either the substrate 2 or the film 4. For example, various known oxides (e.g. of titanium, tin, indium, silicon or others), as well as Nitride, Oxy-Nitride, and Amorphous Silicon may be used (either alone or in combination) for this purpose.

The material of the adhesion layer 6 may also be selected to assist compatibility between the substrate 2 and the film 4. In addition to providing adhesion, the adhesion layer material can assist electrical and/or optical characteristics, film stress issues, or thermal expansion characteristics. The adhesion layer material may be selected to either provide, or prevent, electrical connection between the film 4 and the substrate 2, as desired.

Figure 2B:
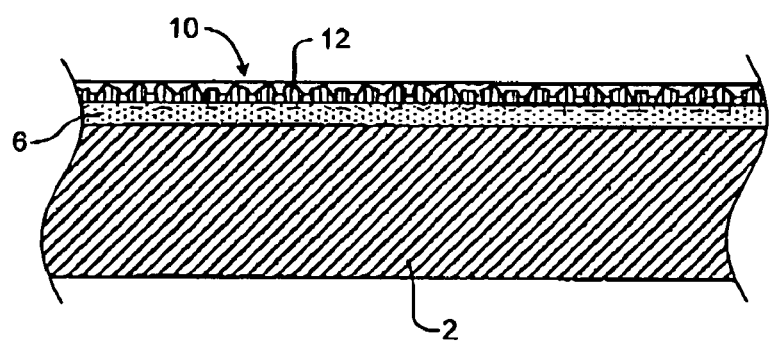
Figure 2C:
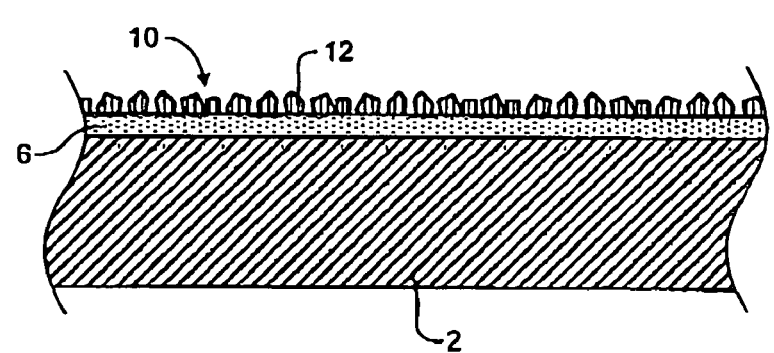
Figure 2D:
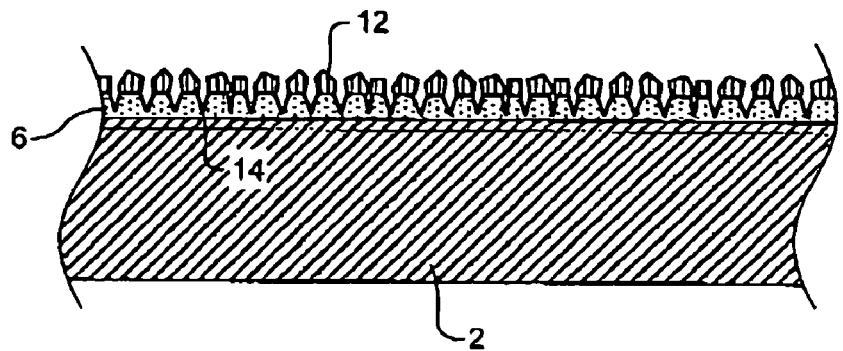

Once the adhesion layer 6 has been formed, its surface 8 is textured to provide a desired surface roughness. Various methods may be employed to achieve this result, (such as, for example: chemical vapour etching; photomask and etch; etc.). In the illustrated embodiment, a mask layer 10 is deposited on the surface 8 of the adhesion layer 6, as shown in FIG. 2b. The mask layer 10 may, for example, be formed by sputtering aluminium and silicon, so as to form randomly distributed silicon nodules 12 embedded within an aluminium matrix. Conventional techniques can be used to control the size, distribution, and density of the silicon nodules 12, as well as the thickness of the mask layer 10 A chemical etching process can then be used to remove the aluminium, while leaving the silicon nodules 12 affixed to the adhesion layer surface 8, as shown In FIG. 2c. The silicon nodules 12 thus form a mask which is used to control the surface-etching of the adhesion layer 6.

Next, an etch process (e.g. a known chemical vapour etch) is performed to texture the adhesion layer surface 8. This can be accomplished by selecting an etching compound that attacks the adhesion layer 6, while leaving the silicon nodules 12. This etching processes creates valleys 14 in the adhesion layer 6, as may be seen in FIG. 2d. The size (width) of the valleys 14 can be controlled by controlling the size and density of silicon nodules 12 within the mask layer 10, as well as the thickness of the mask layer 10. The depth of the valleys 14 can be controlled by varying the thickness of the adhesion layer 6 and the etching time. Taken together, these parameters can be used to achieve a desired roughness of the adhesion layer surface 8, which can thus be tailored to requirements of the film 4.

Figure 2E:
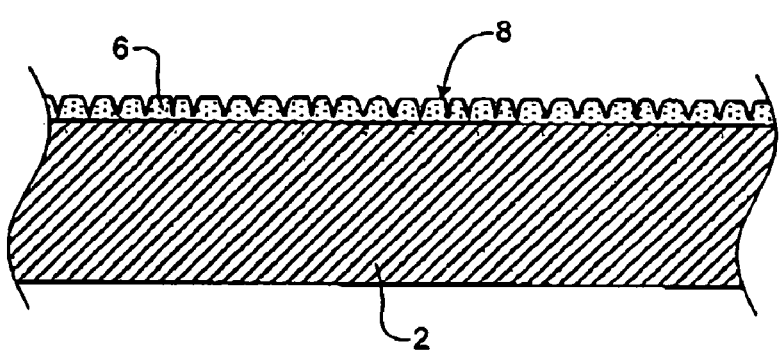

The final step in forming the textured adhesion layer surface 8 involves removing the silicon nodules 12, to thereby expose the adhesion layer 6 with its textured surface 8, as may be seen in FIG. 2e. Known methods may suitably be used to accomplish this step.

With the textured adhesion layer 6 having been formed, the film 4 can then be deposited on the textured adhesion layer surface 8 to yield the structure illustrated in FIG. 1. Known low temperature techniques (such as, for example, sputtering, chemical vapour deposition, spin-coating etc.) may be used to deposit the film 4 on the adhesion layer 6. Because the film 4 substantially fills the valleys 14 formed in the adhesion layer surface 8, a strong mechanical bond is formed between the adhesion layer 6 and the film 4. This ensures that the film 4 will remain secured to the substrate 2 through subsequent processing steps and use of the resulting device.

Figure 3:
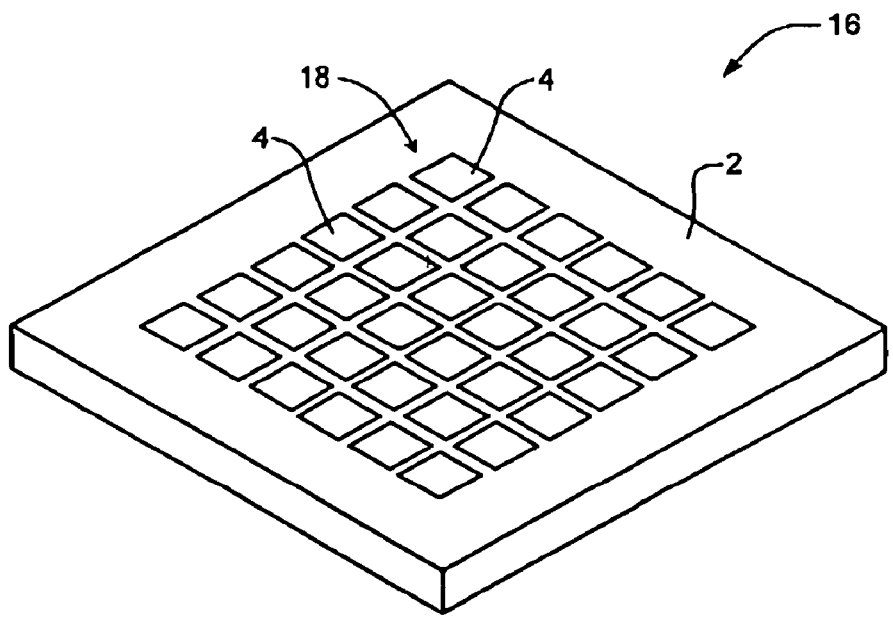
FIG. 3 is a perspective view of a sensor array fabricated in accordance with the present invention.

For example, FIG. 3 illustrates a lead selenium (PbSe) sensor array 16 constructed in accordance with the present invention. In this example, the substrate 2 is a silcon integrated circuit structure constructed using known IC fabrication techniques. The process described above with reference to FIGS. 2a-2e are used to form an array 18 of PbSe film elements 4 on the IC substrate 2. Known techniques can then be used to electrically connect the film elements 4 to input contacts (not shown) of the IC substrate 2 and the "sensitize" the device 16. Because of the secure bond between the PbSe film elements 4 and the IC substrate 2 provided by the textured adhesion layer 6, the PbSe film elements 4 remain firmly affixed to the IC substrate 2 throughout these processing steps.

The embodiment(s) of the invention described above is(are) intended to be exemplary only. The scope of the invention is therefore intended to be limited solely by the scope of the appended claims.

We claim:

1. A method of forming a film on a substrate, the method comprising steps of:
   forming an adhesion layer on the substrate, the adhesion layer being chemically bonded to the substrate and having a textured surface formed by low temperature process, said forming the adhesion layer including:
      i depositing the adhesion layer on the substrate; and
      ii texturing a surface of the adhesion layer by forming a mask layer on the adhesion layer;
   etching the adhesion layer; and removing the mask layer; and forming the film on the textured surface of the adhesion layer.

2. A method as claimed in claim 1, wherein the step of depositing the adhesion layer comprises any one of more of: low temperature plasma desposition low temperature sputtering; and chemical vapour deposition.

3. A method as claimed in claim 1, wherein the step of forming the mask layer comprises steps of: sputtering an mixture of aluminium and silicon onto the adhesion layer; and etching the mixture to remove the aluminium.

4. A method as claimed in claim 1, wherein the step of forming the film comprises any one of more of: sputtering; chemical vapour deposition; and spin-coating.

5. A device comprising a substrate, an adhesion layer, and a film fabricated in accordance with the process of claim 1.

6. A device as claimed in claim 5, wherein the substrate comprises an integrated circuit structure.

7. A device as claimed in claim 5, wherein the adhesion layer is formed of a mixture comprising any one or more of; metallic oxides; silicon oxide; Nitride; Oxy-Nitride; and Amorphous Silicon.

8. A device as claimed in claim 5, wherein the film is a metallic film.

9. A device as claimed in claim 8, wherein the metallic film is lead selinide.

10. A method of forming a film on a substrate, the method comprising steps of: depositing an adhesion layer on the substrate, the adhesion layer being chemically bonded to the substrate and
   texturing a surface of the adhesion layer by:
      forming a mask layer on the adhesion layer;
      etching the adhesion layer; and
      removing the mask layer;
      and
      forming the film on the textured surface of the adhesion layer.

11. A method as claimed in claim 10, wherein the step of forming the mask layer comprises steps of: sputtering an mixture of aluminium and silicon onto the adhesion layer; and etching the mixture to remove the aluminium.

12. A method as claimed in claim 10, wherein the step of depositing the adhesion layer comprises any one of more of: low temperature plasma deposition low temperature sputtering; and chemical vapour deposition.

13. A device comprising a substrate, an adhesion layer, and a film fabricated in accordance with the process of claim 10.

14. A device as claimed in claim 13, wherein the substrate comprises an integrated circuit structure.

15. A device as claimed in claim 13, wherein the adhesion layer is formed of a mixture comprising any one or more of; metallic oxides; silicon oxide; Nitride; Oxy-Nitride; and Amorphous Silicon.

16. A device as claimed in claim 13, wherein the film is a metallic film.

* * * * *